United States Patent
Hsiao et al.

(10) Patent No.: US 6,753,225 B1
(45) Date of Patent: Jun. 22, 2004

(54) METHOD OF FORMING A GATE STRUCTURE

(75) Inventors: Chin-Yuan Hsiao, Taipei Hsien (TW); Yinan Chen, Taipei (TW)

(73) Assignee: Nanya Technology Corp., Tao-Yuan Hsien (TW)

( * ) Notice: Subject to any disclaimer, the term of this patent is extended or adjusted under 35 U.S.C. 154(b) by 0 days.

(21) Appl. No.: 10/604,342

(22) Filed: Jul. 14, 2003

(51) Int. Cl.⁷ .............................................. H01L 21/336
(52) U.S. Cl. ...................................... 438/257; 438/593
(58) Field of Search ................................ 438/257, 593, 438/655–657, 754–755

(56) References Cited

U.S. PATENT DOCUMENTS 6,365,497 B1 * 4/2002 Gonzalez .................... 438/593

* cited by examiner

Primary Examiner—Dung A. Le
(74) Attorney, Agent, or Firm—Winston Hsu (57) ABSTRACT

A method of forming a gate structure. A substrate having thereon at least one stacked gate is provided. The stacked gate has a gate insulating layer, a polysilicon layer, a silicate layer, and a cap layer. A sacrificial layer is deposited on the substrate, and etched backed to expose the cap layer and an upper portion of the silicate layer. Then, the exposed silicate layer is partially removed to form a recess. The recess is filled with silicon nitride. Finally, a spacer is formed on walls of the stacked gate.

14 Claims, 9 Drawing Sheets

METHOD OF FORMING A GATE STRUCTURE

BACKGROUND OF INVENTION

1. Field of the Invention

The present invention relates to a method of forming a gate structure, and more particularly, to a method for preventing the word line and the bit line from generating short circuits.

2. Description of the Prior Art

Dynamic random access memory (DRAM) is composed of many memory cells, and each memory cell has a metal oxide semiconductor (MOS) transistor and a capacitor. The gate of the MOS transistor (also known as word line) serves as a switch of the transistor, while the drain or the source is connected to a bit line for writing and erasing data.

Figure 1:
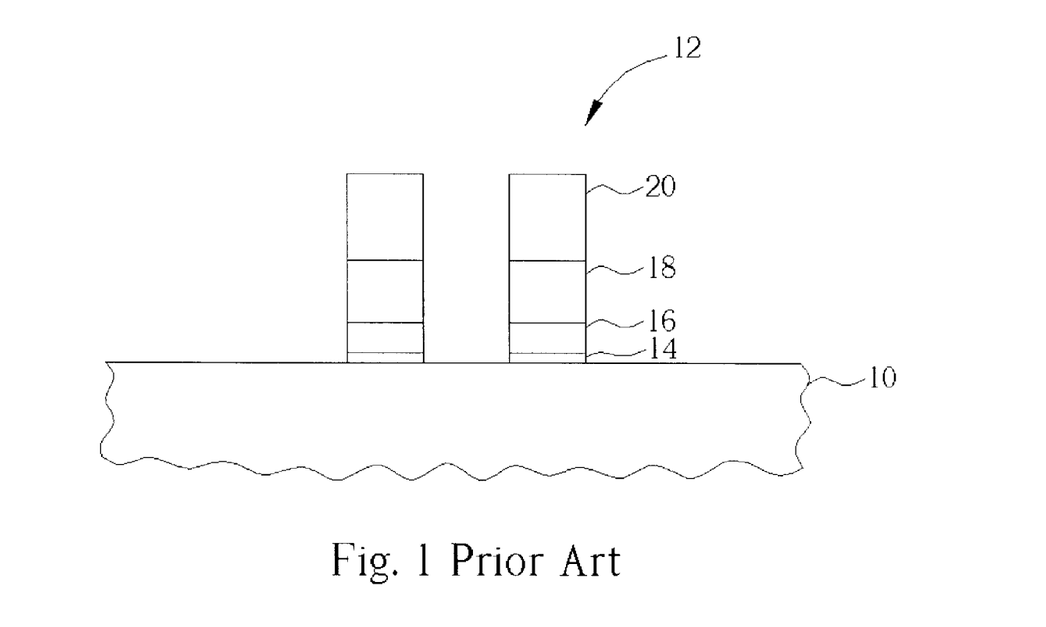
FIG. 1 and FIG. 2 are schematic diagrams illustrating a method of forming a controlling gate of a DRAM according to the prior art.
Figure 2:
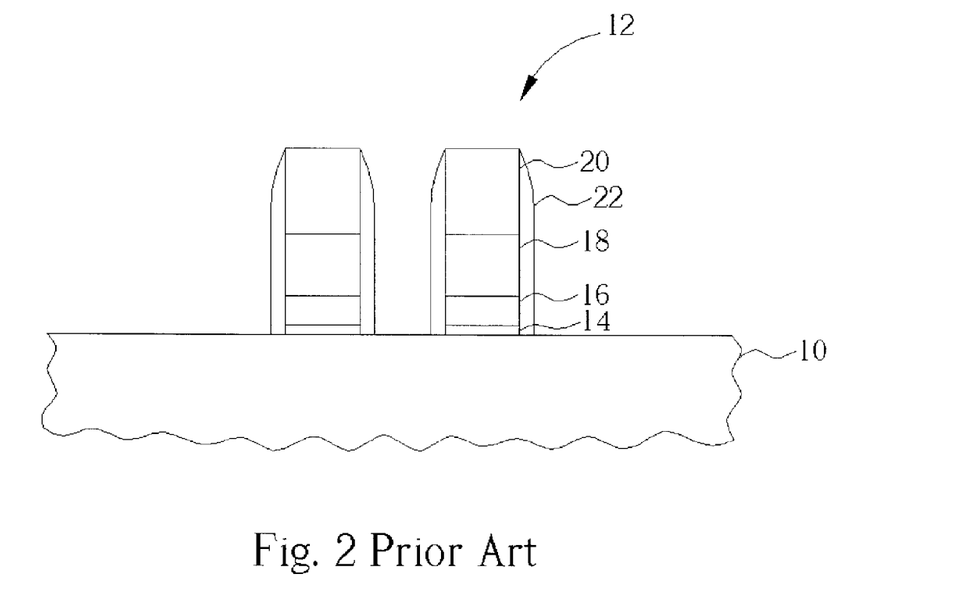

Refer to FIG. 1 and FIG. 2, which are schematic diagrams illustrating a method of forming a controlling gate of a DRAM according to the prior art. As shown in FIG. 1, first a substrate 10 having at least a stacked gate 12 is provided. The stacked gate 12 has a gate insulating layer 14, a polysilicon layer 16, a silicate layer 18, and a cap layer 20.

As shown in FIG. 2, a chemical vapor deposition (CVD) process is performed to form a silicon nitride layer on the substrate 10. Then an anisotropic process is performed to form a spacer 22 on the walls of the stacked gate 12.

After that, an implantation process is performed to form a drain (not shown) and a source (not shown) in the substrate 10.

Figure 3:
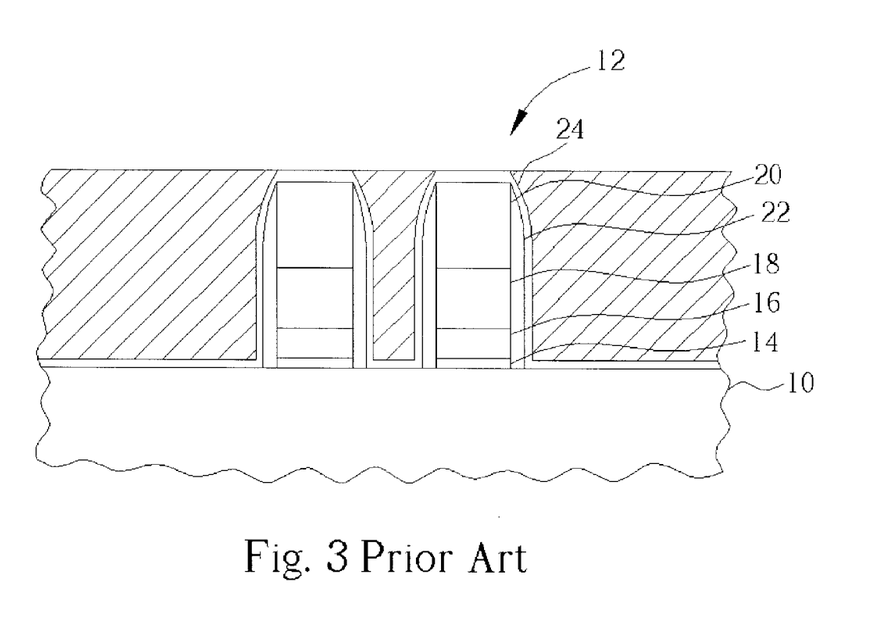
FIG. 3 to FIG. 5 are schematic diagrams illustrating a method of forming a bit line according to the prior art.
Figure 4:
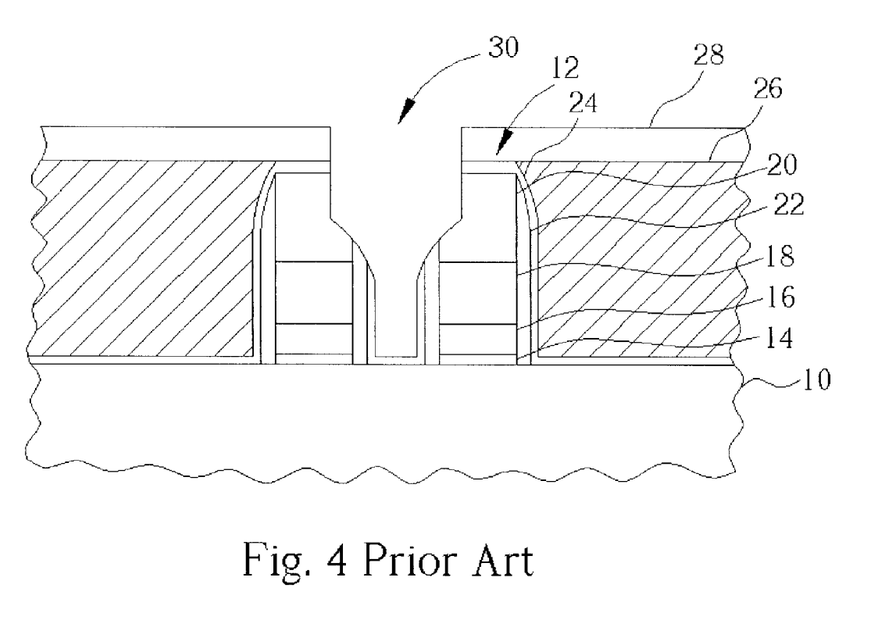
Figure 5:
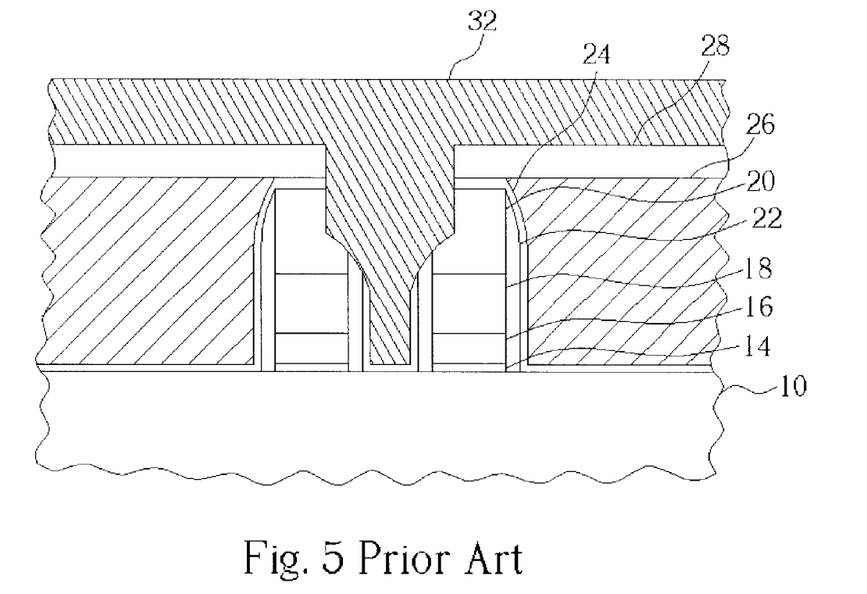

After forming the stacked gate 12, the prior art method further comprises the steps of forming a bit line. Refer to FIG. 3 to FIG. 5 which are schematic diagrams illustrating a method of forming the bit line. As shown in FIG. 3, a barrier layer 24 is deposited on the substrate 10 and on the stacked gate 12 after forming the stacked gate 12. Then a borophosphosilicate glass (BPSG) layer 26 is deposited on the barrier layer 24, and a flow process is performed to planarize the BPSG layer 26. Finally, a chemical mechanical polishing (CMP) process is performed to remove the BPSG layer 26 over the top surface of the cap layer 20. The function of the barrier layer 24 is to prevent the ions of the BPSG layer 26 from diffusing to the substrate 10 during the flow process.

As shown in FIG. 4, a dielectric layer 28 (such as a TEOS layer) is deposited on the stacked gate 12. Then a photo-etching process is performed to remove parts of the dielectric layer 28, the BOSG layer 26, and the barrier layer 24 for forming a contact hole 30.

Finally as shown in FIG. 5, a bit line 32 is formed and electrically connected to the drain (not shown) or the source (not shown).

The prior art method utilizes the spacer to prevent the word line and the bit line from generating short circuits. As the integration of semiconductor elements increases and the dimension decreases day by day, however, the spacer is easily destroyed when forming the contact hole due to misalignment. The bit line and the silicate layer are easily short circuited under this condition, especially when the dimension of the semiconductor process is lower than 0.11 micrometers.

SUMMARY OF INVENTION

It is therefore a primary objective of the claimed invention to provide a method of forming a controlling gate of a DRAM for solving the above-mentioned problems.

According to the claimed invention, a method of forming a controlling gate of a DRAM is disclosed. The method comprises: providing a substrate having at least a stacked gate, the stacked gate comprising a gate insulating layer, a polysilicon layer, a silicate layer, and a cap layer; depositing a sacrificial layer on the stacked gate; etching back the sacrificial layer to expose the cap layer and an upper portion of the silicate layer; removing a portion of the exposed silicate layer to form a recess; removing the sacrificial layer; filling a silicon nitride layer in the recess; and forming a spacer on walls of the stacked gate.

It is an advantage of the claimed invention that a recess is formed in the upper portion of the silicate layer, and a silicon nitride layer is filled intothe recess. Therefore the short circuit problem is effectively avoided.

These and other objectives of the present invention will no doubt become obvious to those of ordinary skill in the art after having read the following detailed description of the preferred embodiment that is illustrated in the various figures and drawings.

DETAILED DESCRIPTION

Figure 6:
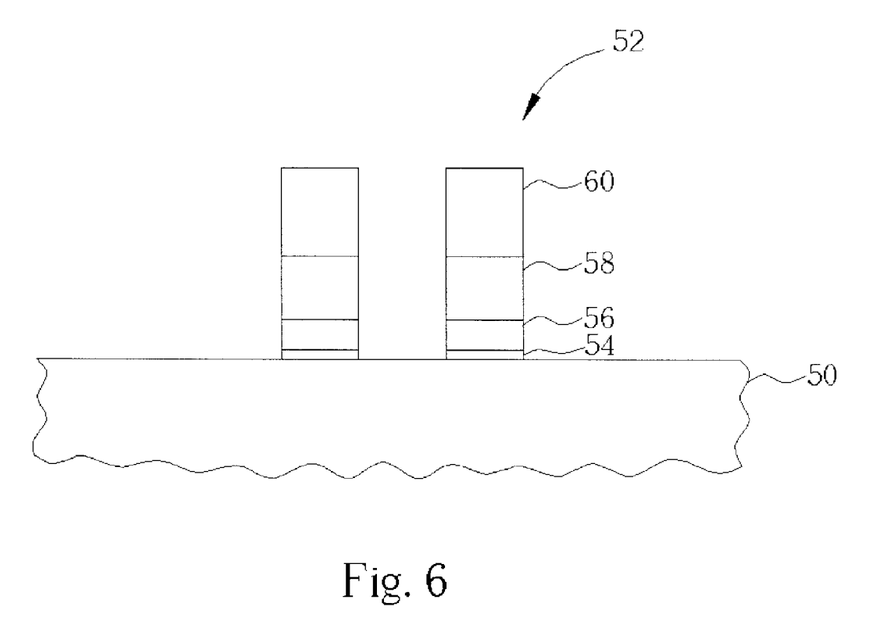
FIG. 6 to FIG. 9 are schematic diagrams illustrating a method of forming a controlling gate of a DRAM according to the present invention.

Refer to FIG. 6 to FIG. 9, which are schematic diagrams illustrating a method of forming a controlling gate of a DRAM according to the present invention. First as shown in FIG. 6, a substrate 50 has at least a stacked gate 52. The stacked gate 52 comprises a gate insulating layer 54, a polysilicon layer 5.6, a silicate layer 58, and a cap layer 60. The polysilicon layer 56 is composed of doped polysilicon, the silicate layer 58 is composed of silicon tungsten ($Wsi_x$), and the cap layer 60 is composed of silicon nitride. It has to be noted that the silicate layer 58 is the word line of DRAM.

Figure 7:
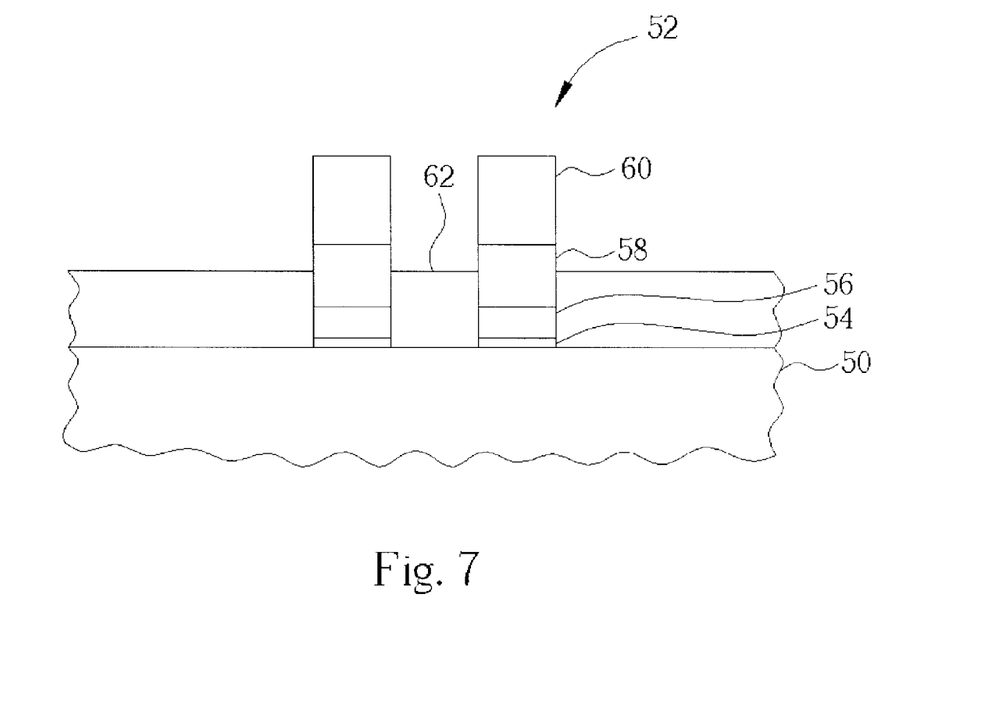

As shown in FIG. 7, a sacrificial layer 62 is deposited on the substrate 50 and the stacked gate 52. Then an etching process is performed to remove parts of the sacrificial layer 62 for exposing the cap layer 60 and the upper portion of the silicate layer 58.

Figure 8:
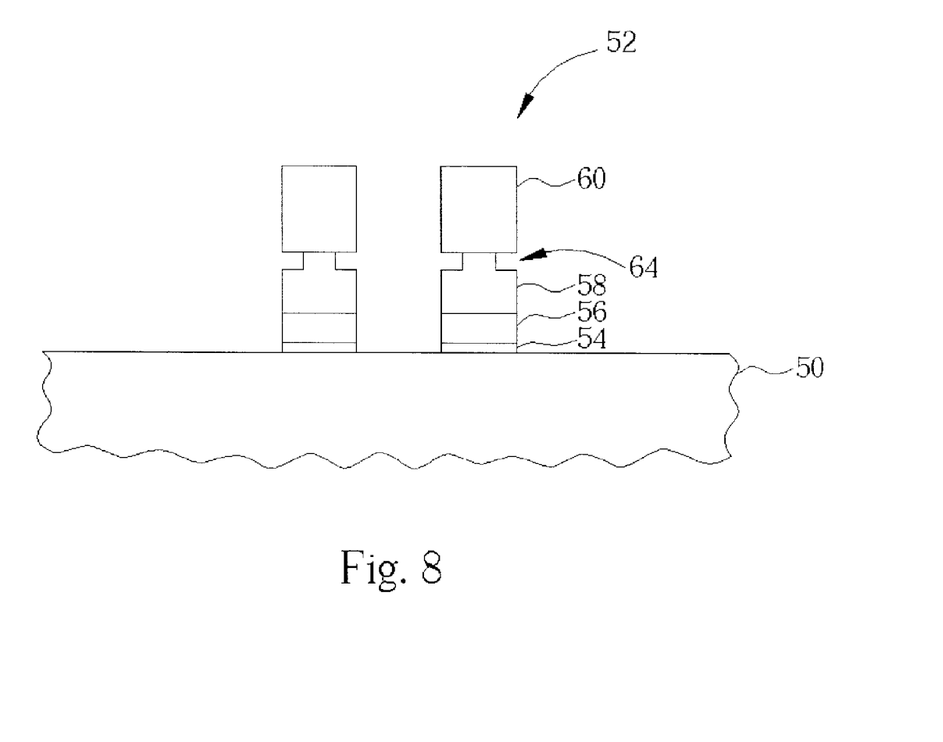

As shown in FIG. 8, an anisotropic etching process is performed to remove parts of the exposed silicate layer 58 for forming a recess 64. Then the remaining sacrificial layer 62 is removed.

Figure 9:
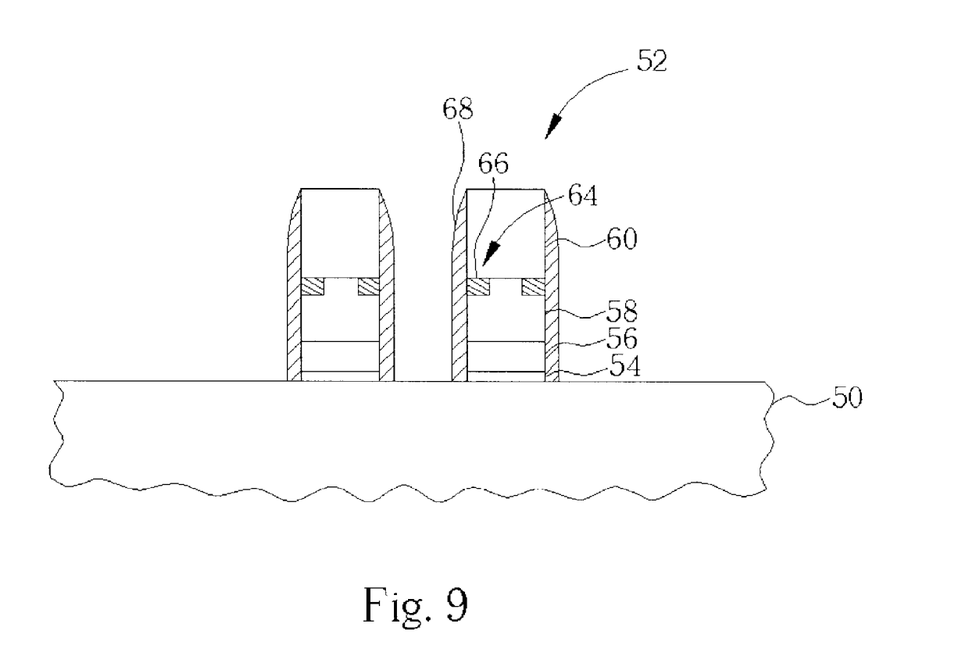

Finally as shown in FIG. 9, a silicon nitride film 66 is deposited to fill up the recess 64, and an etching process is performed to remove the silicon nitride film 66 outside the recess 64. Then another silicon nitride layer is deposited on the stacked gate 52, and another etching process is performed to form a spacer 68 on the walls of the stacked gate 52. It is worth noticing that the step of filling the recess and the step of forming the spacer 68 are respectively carried out by a deposition process and an etching process. However, these two steps can be carried out by a single deposition process and a single etching process in the present invention.

In addition, the method of the present invention further comprises steps of forming the bit line. However, since the steps of the present invention are similar to the steps of the prior art, details are not given here.

Comparing to the prior art, the method of the present invention forms a recess in the upper portion of the sillicate layer, and fills a silicon nitride layer as a passivation layer, such that the word line and bit line will not short circuit. Furthermore, since the silicon nitride layer only occupies a portion of the silicate layer, thus the conductivity of the silicate layer is not reduced.

Those skilled in the art will readily observe that numerous modification and alterations of the device may be made while retaining the teachings of the invention.

Accordingly, the above disclosure should be construed as limited only by the metes and bounds of the appended claims.

What is claimed is:

1. A method of forming a gate structure comprising:

providing a substrate having at least a stacked gate, the stacked gate comprising a gate insulating layer, a polysilicon layer, a silicate layer, and a cap layer;

depositing a sacrificial layer on the stacked gate;

etching back the sacrificial layer to expose the cap layer and an upper portion of the silicate layer;

removing a portion of the exposed silicate layer to form a recess;

removing the sacrificial layer;

filling a silicon nitride layer into the recess; and forming a spacer on walls of the stacked gate.

2. The method of claim 1 wherein the cap layer is composed of silicon nitride.

3. The method of claim 1 wherein the silicate layer is composed of silicon tungsten.

4. The method of claim 1 wherein the recess is formed by an anisotropic etching process.

5. The method of claim 1 wherein steps of filling the silicon nitride layer into the recess further comprises:

depositing a silicon nitride layer on the substrate to fill up the recess; and performing an etching process to remove silicon nitride layer outside the recess.

6. The method of claim 1 wherein steps of forming the spacer further comprises:

depositing a spacer layer on the stacked gate; and performing an etching process to remove parts of the spacer layer for forming a spacer on walls of the stacked gate.

7. The method of claim 6 wherein the spacer layer is composed of silicon nitride.

8. A method of forming a gate structure comprising:

providing a substrate having at least two stacked gates, each stacked gate comprising a gate insulating layer, a polysilicon layer, a silicate layer, and a cap layer;

depositing a sacrificial layer on the substrate between the stacked gates;

etching back the sacrificial layer to expose the cap layer and an upper portion of the silicate layer;

removing a portion of the exposed silicate layer to form a recess;

removing the sacrificial layer;

depositing a silicon nitride layer to fill up the recess; and removing parts of the silicon nitride layer for forming a spacer on walls of the stacked gate.

9. The method of claim 8 after forming the spacer further comprising:

depositing a barrier layer on the substrate;

depositing a borophosphosilicate glass (BPSG) layer on the barrier layer;

performing a flow process for planarizing the BPSG layer;

performing a chemical mechanical polishing (CMP) process for removing the BPSG layer over a top surface of the cap layer;

depositing a dielectric layer on the cap layer and the BPSG layer; and removing parts of the dielectric layer, the BPSG layer, and the barrier layer to form a contact hole between the stacked gates.

10. The method of claim 9 wherein the barrier layer is composed of silicon nitride.

11. The method of claim 9 wherein the dielectric layer is composed of tetra-ethyl-ortho-silicate (TEOS).

12. The method of claim 8 wherein the silicate layer is composed of silicon tungsten.

13. The method of claim 8 wherein the recess is formed by an anisotropic etching process.

14. The method of claim 8 wherein cap layer is composed of silicon nitride.

* * * * *